United States Patent
Suzuki et al.

(10) Patent No.: US 7,612,337 B2
(45) Date of Patent: Nov. 3, 2009

(54) FOCUSED ION BEAM SYSTEM AND A METHOD OF SAMPLE PREPARATION AND OBSERVATION

(75) Inventors: Yuya Suzuki, Hitachinaka (JP); Takeo Kamino, Hitachinaka (JP); Toshie Yaguchi, Omitama (JP); Mitsuru Konno, Hitachinaka (JP); Tsuyoshi Ohnishi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 250 days.

(21) Appl. No.: 11/654,685

(22) Filed: Jan. 18, 2007

(65) Prior Publication Data

US 2007/0187597 A1    Aug. 16, 2007

(30) Foreign Application Priority Data

Feb. 13, 2006   (JP)   .............................. 2006-035507

(51) Int. Cl.
  *H01J 37/26* (2006.01)
  *G01N 23/22* (2006.01)

(52) U.S. Cl. ................. 250/310; 250/306; 250/307; 250/309; 250/311; 250/492.2; 250/492.21; 250/492.22; 250/492.3

(58) Field of Classification Search ............... 250/309, 250/310, 306, 307, 491.1, 492.2, 492.21, 250/492.22, 492.1, 492.3, 311; 850/5, 7, 850/8, 9, 10; 430/296, 297, 298
See application file for complete search history.

(56) References Cited

U.S. PATENT DOCUMENTS

| | | | |
|---|---|---|---|
| 6,740,877 B2 * | 5/2004 | Sawahata et al. ............. | 250/310 |
| 7,173,261 B2 * | 2/2007 | Ogawa et al. .......... | 250/492.21 |
| 7,372,283 B2 * | 5/2008 | Furukawa et al. ........... | 324/750 |
| 2003/0001109 A1 * | 1/2003 | Morio et al. ........... | 250/492.21 |
| 2005/0061971 A1 * | 3/2005 | Terada et al. ................. | 250/307 |
| 2006/0054813 A1 * | 3/2006 | Nokuo et al. ................ | 250/307 |
| 2009/0135240 A1 * | 5/2009 | Phaneuf et al. ............. | 347/246 |

FOREIGN PATENT DOCUMENTS

| JP | 7-29535 A | 1/1995 |
|---|---|---|
| JP | 2000-223061 A | 8/2000 |

* cited by examiner

*Primary Examiner*—Jack I Berman
*Assistant Examiner*—Nicole Ippolito Rausch
(74) *Attorney, Agent, or Firm*—McDermott Will & Emery LLP

(57) ABSTRACT

A focused ion beam system capable of acquiring surface structure information, internal structure information, and internal composition information about a sample simultaneously from the same field of view of the sample. A method of sample preparation and observation employs such focused ion beam system to accurately set a sample processing position based on information about the structure and composition of the sample acquired from multiple directions of the sample, and to process and observe the sample. The system includes, in order to acquire the sample structure and composition information simultaneously, a secondary electron detector, a transmission electron detector, and an energy dispersive X-ray spectroscope or an electron energy loss spectroscope, and employs a stub having the sample rotating and tilting function. The method includes a marking process.

10 Claims, 5 Drawing Sheets

(1)

(2)

(3)

(4)

(5)

(6)

(1)

(2)

(3)

(4)

(5)

(6)

FOCUSED ION BEAM SYSTEM AND A METHOD OF SAMPLE PREPARATION AND OBSERVATION

BACKGROUND OF THE INVENTION

1. Field of the Invention

The present invention relates to focused ion beams, and particularly to a focused ion beam system capable of acquiring surface structure information, internal structure information, and internal composition information about a sample simultaneously. The invention also relates to methods of sample preparation and observation whereby the acquisition of such sample structure and composition information and focused ion beam processing are carried out using a plurality of devices.

2. Background Art

As the semiconductor devices become smaller and smaller in size, the electron microscope has become an indispensable tool for structural analysis. It has also become indispensable to use focused ion beam processing for the preparation of a sample for the observation of an electron microscope image. Focused ion beam processing generally involves capturing a scanning ion microscope (SIM) image and designating a position to be processed. Meanwhile, it is becoming increasingly difficult to set a processing position in semiconductor devices, which are becoming increasingly more multi-layered and complicated, with reference to such SIM images alone. This is due to the fact that the SIM images provide only sample surface information. In response, a method has become more common whereby an image obtained by a separate technique is superposed on the SIM image, as disclosed in Patent Document 1 or 2. The separate technique herein includes methods utilizing optical microscope images or CAD.

Patent Document 1: JP Patent Publication (Kokai) No.2000-223061 A

Patent Document 2: JP Patent Publication (Kokai) No.7-29535 A

SUMMARY OF THE INVENTION

Nowadays, however, there are semiconductor materials that contain 9 to 10 layers of wiring, and in some cases it is difficult to identify a processing position even by the aforementioned method whereby an image obtained by a separate method is superposed on the material. And now that semiconductor production lines with 70 nm nodes are being established, it is becoming increasingly difficult to identify processing positions with the resolution of an optical microscope. In addition, while CAD information can be applied to semiconductor materials that are manufactured according to design, it cannot be applied to abnormal or deficient portions whose contour is difficult to predict.

It is therefore an object of the invention to provide a focused ion beam system capable of acquiring surface structure information, internal structure information, and internal composition information simultaneously from the same field of view of the sample. It is another object of the invention to provide a method of sample preparation and observation whereby a sample processing position can be accurately set based on information about the structure and composition of a sample that is acquired from multiple directions using the aforementioned focused ion beam system.

In accordance with the invention, a focused ion beam system includes: a detector for detecting a secondary electron image based on scanning electron or scanning ion excitation as a detector for obtaining sample surface structure information; a transmission electron detector as a detector for obtaining sample internal structure information; and an energy dispersive X-ray spectroscope or an electron energy loss spectroscope as a detector for obtaining sample composition information. In order to observe the sample from multiple directions, a stub is used that has the sample rotating and tilting functions. Magnification correction between scanning electrons and scanning ions is carried out by comparing a secondary electron image based on scanning electron excitation with a secondary electron image based on scanning ion excitation, both images providing surface structure information about the sample. Superposition of images is facilitated by providing a marking that can be recognized in any observation mode and from any observation direction.

In accordance with the invention, an appropriate focused ion beam processing position can be set on the sample based on surface structure information, internal structure information, and internal composition information about the sample obtained from multiple directions of the sample extracted from an analysis portion. The sample can then be processed and observed with reference to such processing position.

DESCRIPTION OF THE PREFERRED EMBODIMENTS

In the following, preferred embodiments of the focused ion beam system and method of sample preparation and observation according to the invention will be described with reference to the drawings. FIGS. 1 to 5 show the embodiments of the invention, throughout which similar parts having basically identical structure or operation are designated with similar reference signs.

In the focused ion beam system according to each of the embodiments, surface structure information, internal structure information, and internal composition information can be simultaneously acquired from the same field of view of the sample. The system includes a stub that has a rotating function and an tilting function, allowing the sample to be observed from multiple directions. The sample is presumed to have such a thickness as to allow the detection of transmission electrons. In a case where the acquisition of the sample structure and composition information and focused ion beam processing are carried out using a plurality of devices, the individual devices may use a common stub having the rotating function and the tilting function. Images obtained from each of such devices are automatically transferred and superposed.

Figure 1:
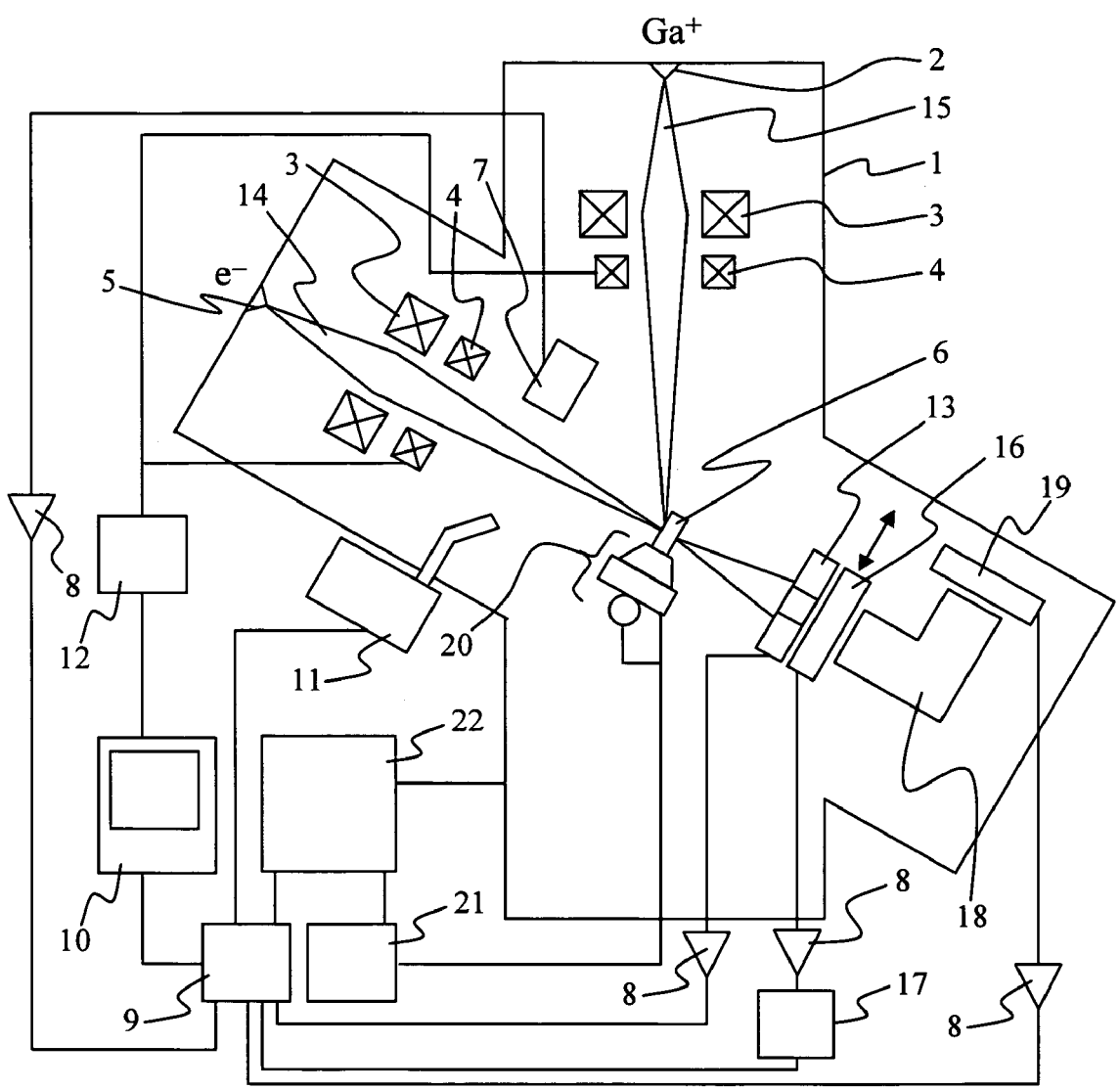
FIG. 1 shows a schematic diagram of a focused ion beam system according to an embodiment of the invention.

FIG. 1 shows a schematic diagram of the focused ion beam system according to an embodiment of the invention. In FIG. 1, a focused ion beam system 1 has a focused ion beam processing function enabled by an ion gun 2, a condenser lens 3, and scanning coils 4. The system also has the function to acquire surface structure information, internal structure information, and internal composition information about a sample 6 simultaneously, which is enabled by an electron gun 5, a condenser lens 3, and scanning coils 4. The sample 6 is disposed below the scanning coils 4. Between the scanning coils 4 and the sample 6, a detector 7 is disposed for detecting secondary electrons produced by scanning electron or ion excitation. The secondary electron detector 7 is connected to a scanning image display unit 10 via a signal amplifier 8 and an image processing unit 9. Between the scanning coils 4 and the sample 6, an EDX detector 11 is also disposed. The EDX detector 11 is connected, via the image processing unit 9, to the scanning image display unit 10. The scanning coils 4 are connected to a scanning power supply 12, to which the scanning image display unit 10 is connected.

Below the sample 6, an annular scattered electron detector 13 is disposed for the observation of a dark field scanning transmission electron microscope (DF-STEM) image. The scattered electron detector 13 is connected, via the signal amplifier 8 and the image processing unit 9, to the scanning image display unit 10. Below the scattered electron detector 13, a transmission electron detector 16 is disposed for the observation of a bright field scanning transmission electron microscope (BF-STEM) image. The transmission electron detector 16 can be moved in and out of the optical axis of the electron beam 14. The transmission electron detector 16 is connected to the signal amplifier 8 and a detector movement control unit 17. The detector is also connected, via the image processing unit 9, to the scanning image display unit 10. Further, below the transmission electron detector 16, a magnetic prism 18 and an EELS detector 19 are disposed. The EELS detector 19 is connected, via the signal amplifier 8 and the image processing unit 9, to the scanning image display unit 10. The scanning image display unit 10 is capable of displaying images of different observation modes in separate windows simultaneously or in the same window in a superposed manner.

The sample 6 is fixed on the stub 20, which has the rotating and tilting functions. The movement of the stub 20 is controlled by a stub control unit 21, which is connected to a CPU processing unit 22. The CPU processing unit 22 is connected to the lens system of the apparatus and the image processing unit 9.

In the thus configured focused ion beam system, an ion beam 15 emitted by the ion gun 2 is focused by the condenser lens 3. The surface of the sample 6 is scanned with the focused ion beam 15 by the scanning coils 4. As the ion beam 15 is irradiated on the sample 6, the sample 6 is sputtered, emitting secondary electrons. The secondary electrons are detected by the secondary electron detector 7. Based on an image (SIM image) produced from the detection signal, the surface structure of the sample 6 is observed and its processing position is set.

On the other hand, an electron beam 14 emitted by the electron gun 5 is focused by the condenser lens 3. The surface of the sample 6 is then scanned with the focused electron beam 14 by the scanning coils 4. As the electron beam 14 is irradiated on the sample 6, the sample 6 emits secondary electrons, which are detected by the secondary electron detector 7. Based on an image (SEM image) produced from the detection signal, the surface structure of the sample 6 is observed. Similarly, a characteristic X-ray emitted by the sample 6 is detected with an EDX detector 11, and the sample is then observed for internal composition information using an elemental map image (EDX map image) based on the detection signal. The electrons scattered by the sample 6 are detected by the scattered electron detector 13, and, using an image (dark field STEM image) based on the detection signal, the sample 6 is observed for its internal structure and compositional information. The electrons that passed through the sample 6 are detected by the transmission electron detector 16, or by the EELS detector 19 after spectrum dispersion by the magnetic prism 18. Using an image based on a detection signal from the transmission electron detector 16 (bright field STEM image) or an elemental map image from the EELS detector 19 (EELS map image), the internal structure of the sample 6 and its compositional information are observed.

Figure 2:
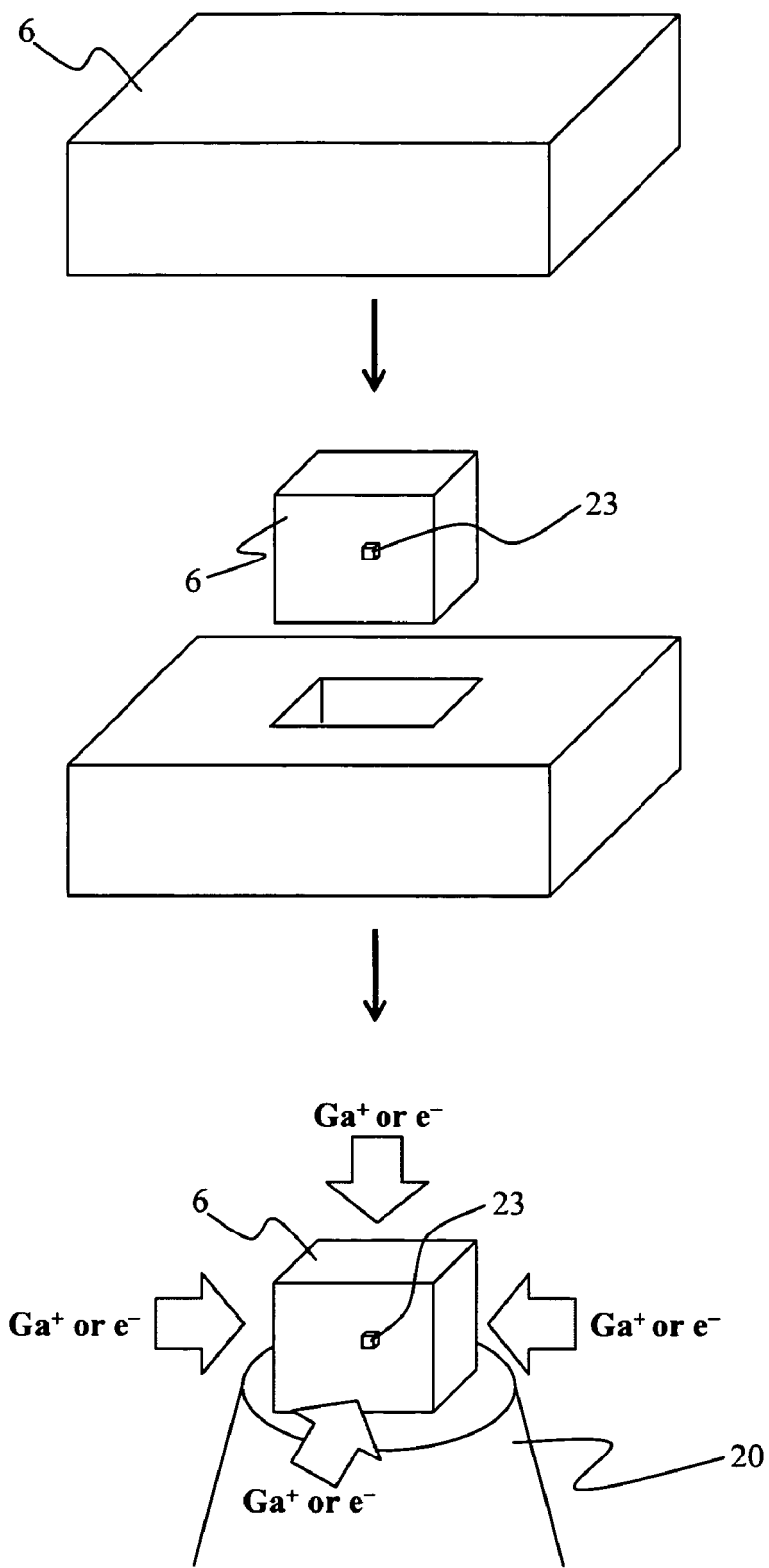
FIG. 2 shows a schematic procedure for the preparation and observation of a sample using the focused ion beam system shown in FIG. 1.

FIG. 2 schematically shows the procedure for the preparation and observation of a sample using the focused ion beam system shown in FIG. 1. In FIG. 2, an analysis portion 23 is extracted from the sample 6 by ion beam processing or the like. The sample 6 including the analysis portion 23 is then fixed on the stub 20, which has the rotating function and the tilting function. The sample 6 is then irradiated with the electron beam 14 or the ion beam 15 from multiple directions so as to acquire its surface structure information, internal structure information, and internal composition information.

Figure 3:
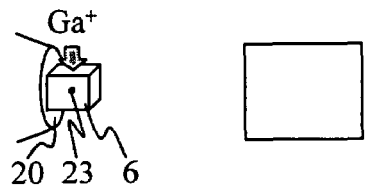
FIG. 3 shows a detailed procedure for the preparation and observation of a sample using the focused ion beam system shown in FIG. 1.
Figure 3:
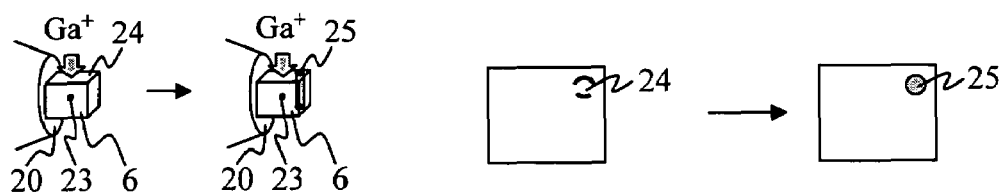
Figure 3:
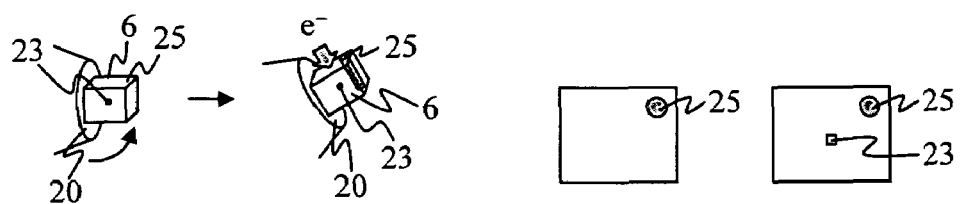
Figure 3:
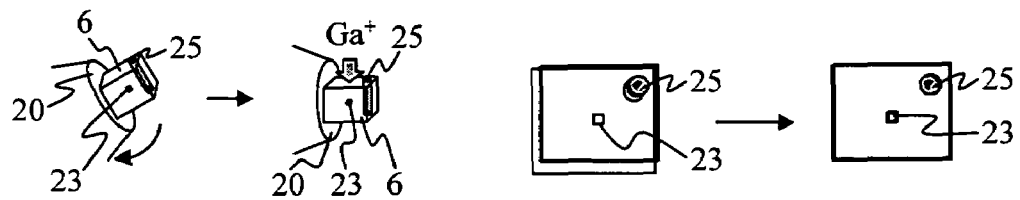
Figure 3:
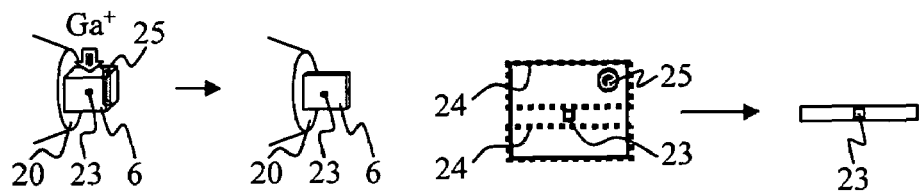
Figure 3:
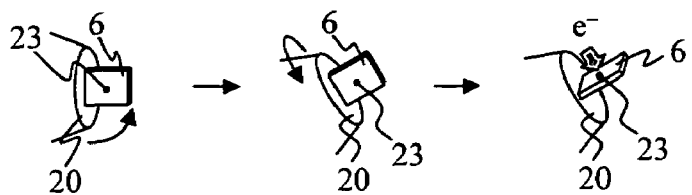

FIG. 3 shows the procedure for the preparation and observation of the sample using the focused ion beam system of FIG. 1 in detail. In the following, the procedure will be described with reference to FIG. 3.

(1) The processing direction of the sample 6 is aligned with the ion beam direction and an SIM image is captured.

(2) A processing region having a desired shape is set on the SIM image acquired in (1). The thus set processing region 24 is then processed and a marking 25 is provided by making an opening in the sample 6. By making the opening by FIB (focused ion beam) processing, the marking 25 can be recognized in every observation mode.

(3) The sample 6 is tilted from the ion beam direction to the electron beam direction, and the surface structure information and internal structure information or internal composition information about the sample 6 is simultaneously acquired. The surface structure information is obtained from the SEM image. The internal structure information or the internal composition information is acquired simultaneously from the same field of view in images selected from a dark field STEM image, a bright field STEM image, an EDX map image, and an EELS map image in which the marking 25 can be placed.

(4) Because the multiple images acquired in (3) are acquired simultaneously within the same field of view, they can be easily superposed. The sample 6 is again tilted toward the ion beam direction, and, using the markings 25 of the multiple images that are superposed, the magnification and position of the SIM image are aligned with those of the superposed images. The images that are superposed may be rendered semitransparent or color-coded by the image processing unit 9.

(5) A processing region 24 is set in the images superposed in (4) such that the analysis portion 23 remains. The processing region 24 thus set is then processed.

(6) The sample 6 is tilted toward the electron beam and rotated by 90°, and the analysis portion 23 is observed and analyzed. If the processing is insufficient, steps (1) to (5) may be repeated.

Figure 4:
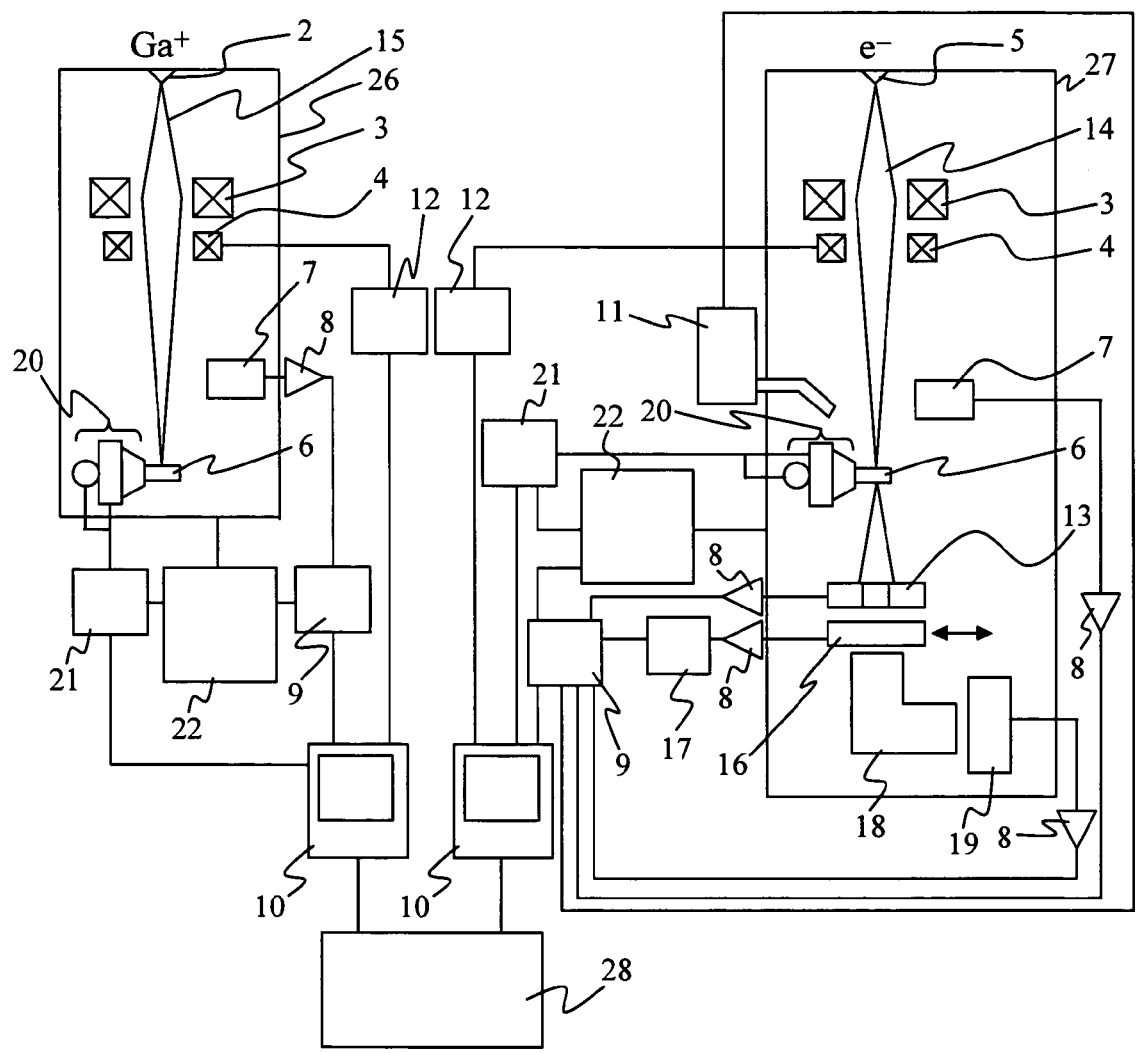
FIG. 4 shows a schematic diagram of a focused ion beam system according to another embodiment of the invention.

FIG. 4 shows a schematic diagram of the focused ion beam system according to another embodiment of the invention. As shown in FIG. 4, the system includes a device 26 having the focused ion beam processing function, and a device 27 having the function to acquire sample surface structure, internal structure, and compositional information simultaneously.

Thus, the acquisition of sample structure and composition information and focused ion beam processing are carried out by separate devices.

The device 26 having the focused ion beam processing function includes an ion gun 2, a condenser lens 3, and scanning coils 4. Below the scanning coils 4, a sample 6 is disposed. Between the scanning coils 4 and the sample 6 is disposed a secondary electron detector 7 for detecting secondary electrons produced by scanning ion excitation. The secondary electron detector 7 is connected, via a signal amplifier 8 and an image processing unit 9, to a scanning image display unit 10. The scanning image display unit 10 of the device 26 is connected to the scanning image display unit 10 of the device 27 via a server 28, via which the images acquired by the device 26 and those acquired by the device 27 are transferred. Each of the scanning image display units 10 is capable of displaying an acquired image and a transferred image in separate windows simultaneously or in the same window in a superposed manner.

The sample 6 is fixed to a stub 20 which has the rotating and tilting functions. The movement of the stub 20 is controlled by the stub control unit 21 to which the stub 20 is connected. The stub control unit 21 is connected to a CPU processing unit 22, which is in turn connected to the lens system of the device and to the image processing unit 9.

In this device 26, the ion beam 15 emitted by the ion gun 2 is focused by the condenser lens 3. With the thus focused ion beam 15, the surface of the sample 6 is scanned by the scanning coils 4. As the sample 6 is irradiated with the ion beam 15, the sample 6 is sputtered, emitting secondary electrons. The secondary electrons are detected by the secondary electron detector 7, and, using an image (SIM image) based on the detection signal, the surface structure of the sample 6 is observed and a processing position is set.

The device 27 having the function to acquire sample surface structure, internal structure, and compositional information simultaneously includes an electron gun 5, a condenser lens 3, and scanning coils 4. Below the scanning coils 4, a sample 6 is disposed. Between the scanning coils 4 and the sample 6, a secondary electron detector 7 for the detection of secondary electrons produced by scanning ion excitation is disposed. The secondary electron detector 7 is connected, via a signal amplifier 8 and an image processing unit 9, to a scanning image display unit 10. Between the scanning coils 4 and the sample 6, there is also disposed an EDX detector 11. The EDX detector 11 is connected via the image processing unit 9 to the scanning image display unit 10. The scanning coils 4 are connected to a scanning power supply 12, to which the scanning image display unit 10 is connected. Below the sample 6, an annular scattered electron detector 13 is disposed for the observation of a dark field scanning transmission electron microscope (DF-STEM) image. The scattered electron detector 13 is connected, via the signal amplifier 8 and the image processing unit 9, to the scanning image display unit 10. Below the scattered electron detector 13, a transmission electron detector 16 is disposed for the observation of a bright field scanning transmission electron microscope (BF-STEM) image. The transmission electron detector 16 can be moved into and out of the optical axis of the electron beam 14. The transmission electron detector 16 is connected to the signal amplifier 8 and to the detector movement control unit 17 and further to the scanning image display unit 10 via the image processing unit 9. Below the transmission electron detector 16, a magnetic prism 18 and an EELS detector 19 are disposed. The EELS detector 19 is connected via the signal amplifier 8 and the image processing unit 9 to the scanning image display unit 10. The scanning image display unit 10 of the device 27 is connected to the scanning image display unit 10 of the device 26 via a server 28, via which images acquired by the device 26 and those acquired by the device 27 are transferred. The scanning image display unit 10 is capable of displaying the images in different observation modes simultaneously in separate windows or in the same window in a superposed manner. Further, the scanning image display unit 10 is capable of displaying an acquired image and a transferred image simultaneously in separate windows or in the same widow in a superposed manner.

The sample 6 is fixed to a stub 20 having the rotating and tilting functions. The movement of the stub 20 is controlled by the stub control unit 21 to which the stub is connected. The stub control unit 21 is connected to a CPU processing unit 22. The CPU processing unit 22 is also connected to the lens system of the device and to the image processing unit 9.

In this device 27, the electron beam 14 emitted by the electron gun 5 is focused by the condenser lens 3. With the thus focused electron beam 14, the surface of the sample 6 is scanned by the scanning coils 4. As the electron beam 14 is irradiated on the sample 6, secondary electrons are emitted by the sample 6 which are detected by the secondary electron detector 7. Using an image (SEM image) based on the detection signal, the surface structure observation of the sample 6 is conducted. Similarly, a characteristic X-ray emitted by the sample 6 is detected by the EDX detector 11, and, using an elemental map image (EDX map image) based on the detection signal, the internal composition information observation of the sample 6 is conducted. The electrons scattered by the sample 6 are detected by the scattered electron detector 13, and, using an image (dark field STEM image) based on the detection signal, the internal structure and compositional information observation of the sample 6 is conducted. The electrons that passed through the sample 6 are detected by the transmission electron detector 16 or by the EELS detector 19 after spectrum dispersion with the magnetic prism 18. Then, using an image (bright field STEM image) based on a detection signal from the transmission electron detector 16 or an elemental map image (EELS map image) based on a detection signal from the EELS detector 19, the internal structure and compositional information observation of the sample 6 is conducted.

Figure 5:
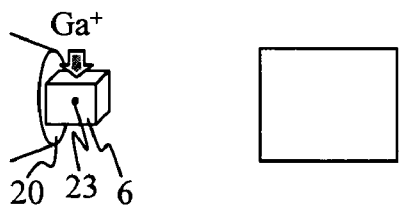
FIG. 5 shows a detailed procedure for the preparation and observation of a sample using the focused ion beam system shown in FIG. 4.
Figure 5:
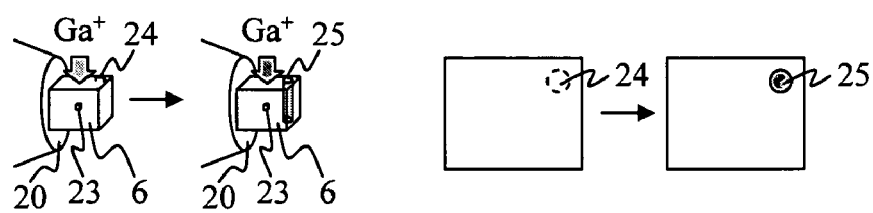
Figure 5:
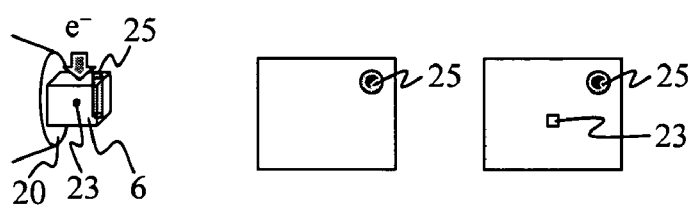
Figure 5:
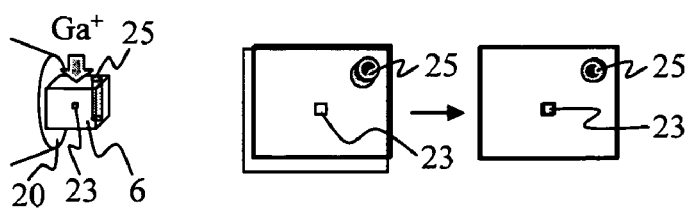
Figure 5:
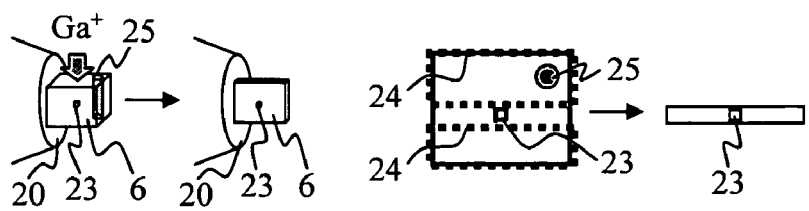
Figure 5:
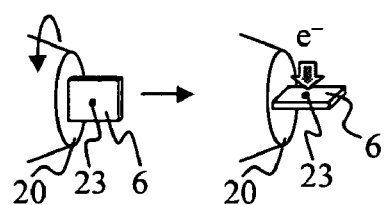

FIG. 5 is a detailed procedure for the preparation and observation of the sample using the focused ion beam system shown in FIG. 4. In the following, the procedure will be described with reference to FIG. 5.

(1) In the device 26 having the focused ion beam processing function, the processing direction of the sample 6 is aligned with the ion beam direction, and then an SIM image is captured.

(2) On the SIM image taken in (1), a processing region 24 with a desired shape is set. The thus set processing region 24 is then processed and a marking 25 is provided by making an opening in the sample 6. By making the opening by FIB processing, the marking can be recognized in every observation mode.

(3) The sample 6, together with the stub 20, is moved to the device 27 having the function to simultaneously acquire the surface structure and internal structure or compositional information, and the surface structure information and internal structure information or internal composition information about the sample 6 are acquired simultaneously. The surface structure information is acquired from an SEM image. The internal structure information or the internal composition information is acquired from the same field of view in images selected from a dark field STEM image, a bright field STEM image, an EDX map image, and an EELS map image simultaneously in which the marking can be placed.

(4) Because the multiple images acquired in (3) are acquired from the same field of view simultaneously, they can be easily superposed. The sample 6 is again moved to the device 26 having the focused ion beam processing function. Then, using the markings of the multiple superposed images transferred from the device 27, which has the function to simultaneously acquire the surface structure and internal structure or compositional information, the magnification and position of the SIM image are aligned with those of the superposed images. The superposed images may be rendered semitransparent or color-coded by the image processing unit 9.

(5) A processing region 24 is set on the images superposed in (4) such that an analysis portion 23 is left, and the thus set processing region 24 is processed.

(6) The sample 6 is moved to the device 27 having the function to simultaneously acquire the surface structure and internal structure or compositional information. The stub 20 is rotated by 90° and the analysis portion is observed and analyzed. If the processing is insufficient, steps (1) to (5) may be repeated.

While the invention have been described above with reference to preferred embodiments thereof, it will be understood by those skilled in the art that the foregoing and other changes in form and detail may be made therein without departing from the spirit and scope of the invention.

What is claimed is:

1. A focused ion beam system comprising:
   an ion beam source which generates an ion beam;
   a detector for obtaining surface structure information and either internal structure information or internal composition information about a sample based on the result of scanning the sample with an electron beam, wherein each information is obtained from the same field of view as a processing region which is set on the sample based on a secondary electron image obtained by scanning ion excitation of the sample; and
   a processor for generating an image in which the surface structure information and internal structure information or internal composition information that is acquired of the sample are superposed,
   wherein then a processing position of the sample is set based on the superposed image and the sample is processed using a focused ion beam, and
   wherein the detector detects a secondary electron image based on scanning electron or scanning ion excitation and wherein the internal structure information or internal composition information about the sample is obtained using at least one of an energy dispersive X-ray spectroscope (EDX), an electron energy loss spectroscope (EELS) and a transmission electron detector, as the detector.

2. The focused ion beam system according to claim 1, wherein the surface structure information about the sample is obtained based on a secondary electron image that is obtained by scanning electron excitation of the sample, and wherein the internal structure information or internal composition information about the sample is obtained based on at least one of an elemental map image obtained from a characteristic X-ray, an image of scattered electrons, an image of transmission electrons, and an elemental map image obtained from transmission electrons, upon scanning electron excitation of the sample.

3. The focused ion beam system according to claim 1, comprising a stub for fixing a sample, wherein the stub is capable of causing one surface of the sample to be directed opposite an ion source or an electron source, and rotating a fixing plane thereof.

4. A focused ion beam system comprising:
   a processor for processing a processing region on a sample using a focused ion beam wherein the processing region is set based on a secondary electron image obtained by scanning ion excitation of the sample;
   a detector for obtaining surface structure information and either internal structure information or internal composition information about the sample, based on the result of scanning the sample with an electron beam; and
   an actuator for actuating a stub, on which the sample is fixed, so as to apply it to the first or the second device,
   wherein a processing region is set on the sample based on an image and then processed by the first device, the image having the surface structure information and the internal structure information or internal composition information about the sample obtained in the second device superposed therein.

5. The focused ion beam system according to claim 4, wherein in the detector, the surface structure information about the sample is obtained based on a secondary electron image obtained by scanning electron excitation of the sample, and the internal structure information or internal composition information about the sample is obtained based on at least one of an elemental map image obtained from a characteristic X-ray, an image of scattered electrons, an image of transmission electrons, and an elemental map image obtained from transmission electrons, upon scanning electron excitation of the sample.

6. The focused ion beam system according to claim 4, wherein the detector obtains a secondary electron image based on scanning electron or scanning ion excitation and wherein the internal structure information or internal composition information about the sample is obtained using at least one of an energy dispersive X-ray spectroscope, an electron energy loss spectroscope and a transmission electron detector, as the detector.

7. The focused ion beam system according to claim 5, wherein the detector obtains a secondary electron image based on scanning electron or scanning ion excitation and wherein the internal structure information or internal composition information about the sample is obtained using at least one of an energy dispersive X-ray spectroscope, an electron energy loss spectroscope and a transmission electron detector, as the detector.

8. A method of sample preparation and observation using a focused ion beam, comprising the steps of:
   setting a processing region on a sample based on a secondary electron image based on scanning ion excitation of the sample;
   obtaining surface structure information and either internal structure information or internal composition information about the sample based on the result of scanning the sample with an electron beam;
   generating an image in which the surface structure information and either the internal structure information or internal composition information about the sample are superposed; and
   setting a processing position on the sample based on the superposed image and processing the sample using a focused ion beam.

9. The method according to claim 8, wherein the surface structure information about the sample is obtained based on a secondary electron image based on scanning electron excitation of the sample, and wherein the internal structure information or internal composition information about the sample is obtained based on at least one of an elemental map image obtained from a characteristic X-ray, an image of scattered electrons, an image of transmission electrons, and an elemental map image obtained from transmission electrons, upon scanning electron excitation of the sample.

10. The method according to claim 8, wherein the sample is processed using a focused ion beam to provide it with a marking that can be recognized in terms of any of the surface structure information, internal structure information, and internal composition information about the sample, and wherein an image is generated with respect to the marking in which the surface structure information and the internal structure information or internal composition information about the sample are superposed.

\* \* \* \* \*